(12) United States Patent
Lai et al.

(10) Patent No.: US 7,164,114 B2
(45) Date of Patent: Jan. 16, 2007

(54) DIGITAL PIXEL SENSOR WITH CLOCK COUNT OUTPUT AND OPERATING METHOD THEREOF

(75) Inventors: Cheng-Hsiao Lai, Taipei (TW); Ya-Chin King, Taipei (TW)

(73) Assignee: Via Technologies Inc., Taipei (TW)

( * ) Notice: Subject to any disclaimer, the term of this patent is extended or adjusted under 35 U.S.C. 154(b) by 0 days.

(21) Appl. No.: 11/145,026

(22) Filed: Jun. 3, 2005

(65) Prior Publication Data

US 2005/0270084 A1    Dec. 8, 2005

Related U.S. Application Data

(60) Provisional application No. 60/577,260, filed on Jun. 4, 2004.

(51) Int. Cl.
*H03K 17/78* (2006.01)
*H03M 1/12* (2006.01)

(52) U.S. Cl. ............... 250/214 DC; 327/514; 341/155

(58) Field of Classification Search ............. 250/208.1, 250/214 R, 214 A, 214 DC; 327/514; 348/308, 348/297; 341/155
See application file for complete search history.

(56) References Cited

U.S. PATENT DOCUMENTS

| | | | |
|---|---|---|---|
| 5,565,915 A * | 10/1996 | Kindo et al. | 348/308 |
| 6,377,303 B1 * | 4/2002 | O'Connor | 348/308 |
| 6,525,304 B1 * | 2/2003 | Merrill et al. | 250/208.1 |
| 6,642,503 B1 * | 11/2003 | Kummaraguntla et al. | 250/214.1 |
| 6,704,046 B1 * | 3/2004 | Dyas et al. | 348/223.1 |
| 2003/0076432 A1 * | 4/2003 | Luo et al. | 348/308 |

* cited by examiner

*Primary Examiner*—Thanh X. Luu
(74) *Attorney, Agent, or Firm*—Thomas, Kayden, Horstemeyer & Risley

(57) ABSTRACT

A digital pixel sensor, comprising a first switch coupled between a first voltage and a first node, turned on or off by a rest signal to provide a first voltage to the first node when turned on; a light sensing unit coupled to the first node generating a transformation current responsive to the intensity of an incident light source and thereby discharging the first node, and a decision device coupled with the first node and a reference signal to output an intensity reference signal corresponding to the intensity of the incident light source when the voltage at the first node is discharged to a level below that of the reference signal.

11 Claims, 10 Drawing Sheets

DIGITAL PIXEL SENSOR WITH CLOCK COUNT OUTPUT AND OPERATING METHOD THEREOF

CROSS-REFERENCE TO RELATED APPLICATION

This application claims priority to U.S. provisional application Ser. No. 60/577,260, filed Jun. 4, 2004.

BACKGROUND

The invention relates to a pixel sensor and more particularly to a digital pixel sensor (DPS) employing MOS transistors.

FIG. 1 is a circuit diagram illustrating a conventional analog pixel sensor. As shown in FIG. 1, the analog pixel sensor 1 includes a photodiode 10, a MOS transistor M1, a MOS transistor M2, and a MOS transistor M3.

When operating, the voltage of a reset signal RS is first pulled up to a high level, turning on transistor M1 and pulling the voltage at node PD up to VDD-$V_{th}$, where $V_{th}$ is the threshold voltage of the transistor M1. Reset signal RS is then pulled down to a low level, turning off the transistor M1 and allowing the voltage of node PD to float. Photo diode 10 is illuminated by an incident light source, which produces a photocurrent of electron-hole pairs to flow in the photo diode 10. The electron field across the depletion region sweeps the electrons to node PD for storage, while concurrently, the holes are carried away by the current through the substrate. As a result of the discharge, the voltage at node PD falls gradually, with increased intensity of the incident light source, generating more electrons in photodiode 10, which speeds drop of voltage at node PD.

FIG. 2 is a relational diagram of the voltage $V_{out}$ of the output signal OUT produced by the pixel sensor 1 with the voltage $V_{RST}$ of the reset signal RS, wherein the output signal OUT is read out through the transistors M2 and M3, controlled by a control signal SEL. As shown in FIG. 2, when the voltage $V_{RST}$ of the reset signal RS is at a low level, all voltages $V_{OUT}$ of the output signals OUT corresponding to different illumination intensities of the incident light source decays with time as shown by arrow 11. As illumination intensity increases, the Vout voltage drop speeds up. FIG. 3 further illustrates the voltage drop of the output signal OUT as a function of the illumination intensity of the incident light source. As shown in the figure, the voltage drop of VOUT increases with illumination intensity until it reaches a saturation state, the incident light source having a specific intensity Imax.

In the conventional pixel sensor 1, the output signal OUT representing the intensity of the incident light source is an analog signal, necessitating a conversion to a corresponding digital signal for successive processing. Obviously, if a digital signal can be output directly, both costs and processing time can be reduced.

FIG. 4 is a schematic diagram of a pixel sensor 4 producing a digital output signal, as proposed by Stanford Group. After the pixel sensor 4 is illuminated by an incident light source, the voltage at node D is transferred through a transmission gate (transistor) TX to the inverting node of a comparator 30 to act as an input signal IN, while a ramp signal Ramp is input to the non-inverting node of the comparator 30. When the voltage of the ramp signal Ramp meets that of the input signal, the output signal of the comparator 30 falls from the original high level to a low level, further driving a memory 31 to lock and store the number registered by a counter 31. Data stored in the memory 31 is then read out by a sensor amplifier (not shown). The digital pixel sensor, however, includes a large number of transistors, and therefore increases costs.

SUMMARY OF THE INVENTION

The invention relates to a pixel sensor, and particularly to a digital pixel sensor with an increased dynamic range.

A digital pixel sensor in accordance with an embodiment of the present invention comprises a first switch coupled between a first voltage source and a first node, controlled by a reset signal to turn on or off, providing a first voltage originating with the first voltage source to the first node when turned on, a light sensing unit coupled to the first node, generating a transformation current responsive to the incident light source thereby discharging the first node, and a decision device coupled to the first node and a reference signal source, generating an intensity reference signal corresponding to the intensity of the incident light source when the voltage at the first node is discharged to a level below that of the reference signal.

An operating method of a digital pixel sensor is also provided, wherein the pixel sensor comprises a first switch coupled between a first voltage and a first node, a light sensing unit coupled to the first node, and a decision device coupled with a first node and a reference signal. The operating method comprises sending the reset signal to turn on the first switch and maintain the first node at a first voltage originating with the first voltage source, interrupting transmission of the reset signal to turn off sthe first switch, maintaining the voltage at the first node at the first voltage, illuminating the light sensing unit with an incident light source to generate a transformation current in the sensing unit, wherein the transformation current flows to the first node, thereby changing the voltage at the first node, detection of the voltage of the reference signal and that at the first node by the decision device, and outputting an intensity reference signal corresponding to the intensity of the incident light source through the decision device when the voltage at the first node is below that of the reference signal.

BRIEF DESCRIPTION OF THE DRAWINGS

The foregoing and other advantages and features of the invention will become more apparent from the detailed description of exemplary embodiments of the invention given below with reference to the accompanying drawings in which.

DETAILED DESCRIPTION OF THE INVENTION

Figure 5:
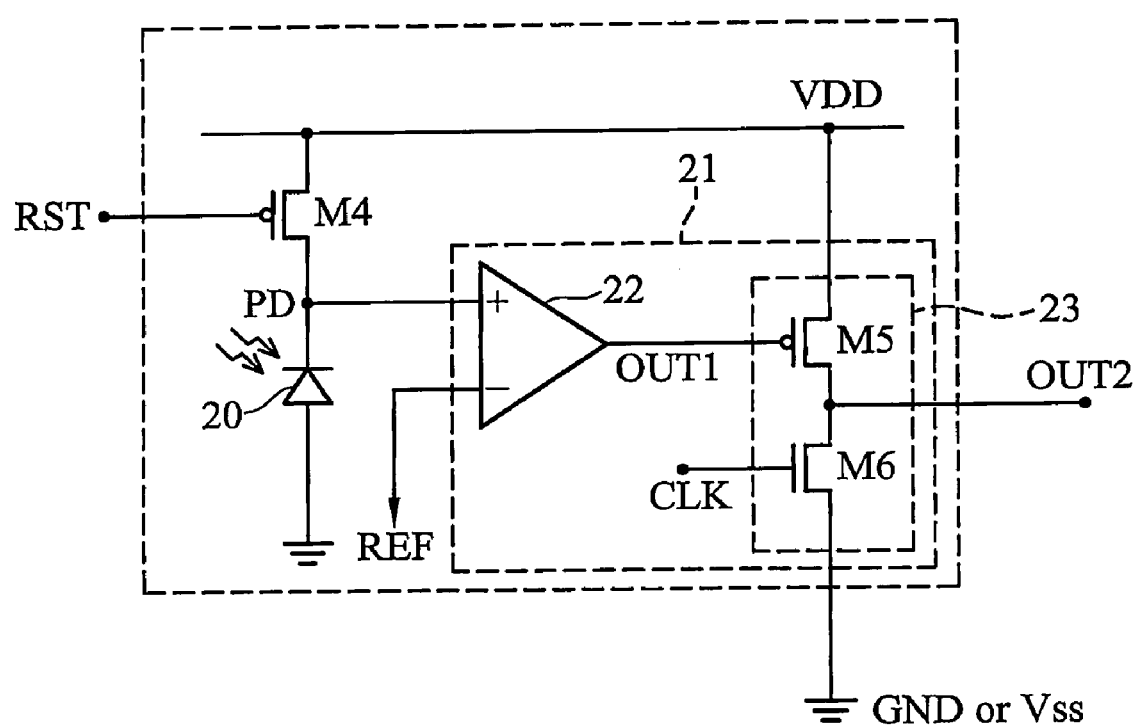
FIG. 5 is a schematic diagram of a digital pixel sensor in accordance with the present invention.

FIG. 5 is a schematic diagram of a digital pixel sensor (DPS) in accordance with the present invention. The digital pixel sensor 2 includes a first switch M4, a light sensing unit 20, and a decision device 21.

The first switch M4 is connected between a node PD and a specific voltage source, and its gate receives a reset signal RST turning it on or off. Here the first switch M4 can be a PMOS or a NMOS transistor, wherein if a PMOS transistor is employed, the Reset level of the node PD does not depend on the threshold voltage of the first switch M4. Additionally, the specific voltage source in the embodiment is realized by a voltage source VDD, although the disclosure is not limited thereto.

The light sensing unit 20, such as a photodiode or phototransistor, is coupled to the node PD. When the first switch turns off, the light sensing unit 20 detects incident light from an incident light source and generate a photocurrent or transformation current in response. The voltage $V_{PD}$ at the node PD then discharges due to the transformation current and falls accordingly.

The decision device 21 is coupled to both the first node PD and a reference signal REF. As the voltage $V_{PD}$ at the node PD falls below the voltage $V_{ref}$ of the reference signal, the decision device 21 outputs an intensity reference signal at the output terminal OUT2 of the pixel sensor 2, corresponding to the intensity of the incident light source.

The decision device 21 comprises a comparison device 22 and a transformation device 23 which includes a second switch M5 and a third switch M6. The comparison device 22, such as a comparator, with non-inverting node (+) connected to the node PD and inverting node(−) connected to the reference signal REF, compares the voltage at node PD with that of the reference signal, further outputting the comparison result through output terminal OUT1. The second switch M5, such as a PMOS transistor, connected between the voltage source VDD and the output terminal OUT2 of the decision device 21, turns on or off according to the comparison result produced by the comparison device 22, to which its gate is coupled. The third switch M6, such as a NMOS transistor, connected between the output terminal OUT2 and a reference node (for example, a low voltage source VSS or ground GND), turns on or off according to a clock signal CLK to which its gate is coupled. Reference signal REF is provided by a reference signal source (not shown) changing the reference signal REF based on at least one command, such that the operation of the digital pixel sensor is controlled.

Figure 6:
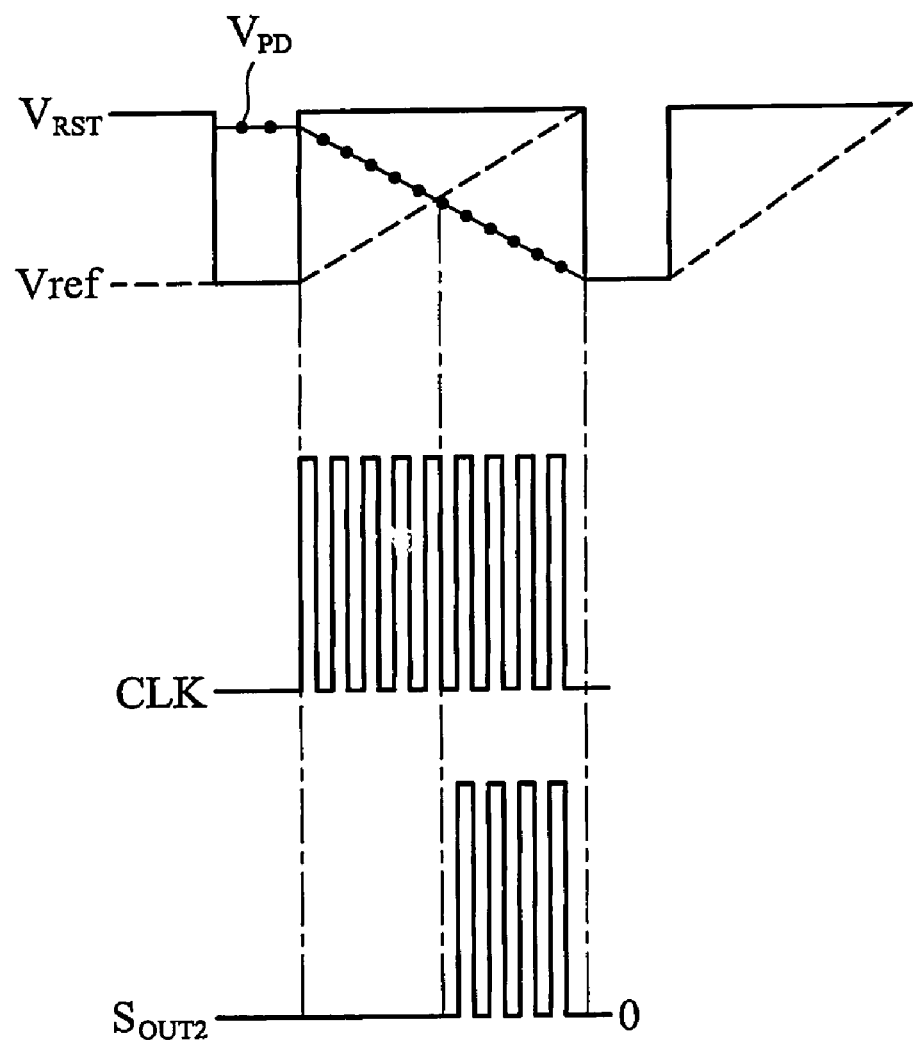
FIG. 6 is an operating timing diagram of the pixel sensor in FIG. 5.

FIG. 6 is an operation timing diagram of the pixel sensor 2 in FIG. 5, illustrating timing of the voltage $V_{RST}$ of the reset signal RST, the voltage $V_{ref}$ of the reference signal REF, the voltage $V_{PD}$ at node PD, the clock signal CLK, and the intensity reference signal $S_{OUT2}$ at the output terminal OUT2, wherein the reference signal REF is a rising ramp signal.

When the reset signal RST is pulled down to a low level, the first switch M4 turns on, pulling up the voltage $V_{PD}$ at node PD to VDD. Because the voltage Vref of the reference signal REF is lower than the voltage VPD at node PD, the comparison device 22 outputs a high-level output, turning the PMOS transistor M5 (the second switch) off. Concurrently, the NMOS transistor M6 turns on or off according to the clock signal CLK. As a result, the voltage at the output terminal OUT2 remains low.

As the voltage $V_{RST}$ of the reset signal RST is again pulled up, PMOS transistor M4 (the first switch) turns off. The light sensing unit 20 detects the illumination intensity of the incident light and generates a photocurrent in response. The photocurrent further discharges and lowers the voltage $V_{PD}$ at the node PD. Meanwhile, the voltage $V_{ref}$ of the reference signal REF is increased gradually. As the voltage $V_{PD}$ at node PD meets the voltage Vref of the reference signal, the voltage at the output terminal OUT1 of the comparison device 22 changes from high to low. The low-level output voltage OUT1 is then used as an enable signal to turn on the PMOS transistor M5 (the second switch), the NMOS transistor M6 (the third switch) still turning on or off according to the clock signal CLK. Every time the NMOS transistor M6 (the third switch) turns on, the output voltage at node OUT2 is pulled down to a low level or to ground, while every time it turns off, the voltage at OUT2 is pulled up to the high level VDD. The intensity reference signal $S_{OUT2}$ corresponding to the intensity of the incident light can thus be obtained at the output terminal OUT2 with pulse numbers proportional to the illumination intensity of the incident light source.

Compared to the conventional analog pixel sensor 1 producing only analog output, the digital pixel sensor according to the embodiment can provide two output types: the time for which the output of the comparison device changes from high to low, and the pulse numbers of the output signal $S_{OUT2}$.

Figure 1:
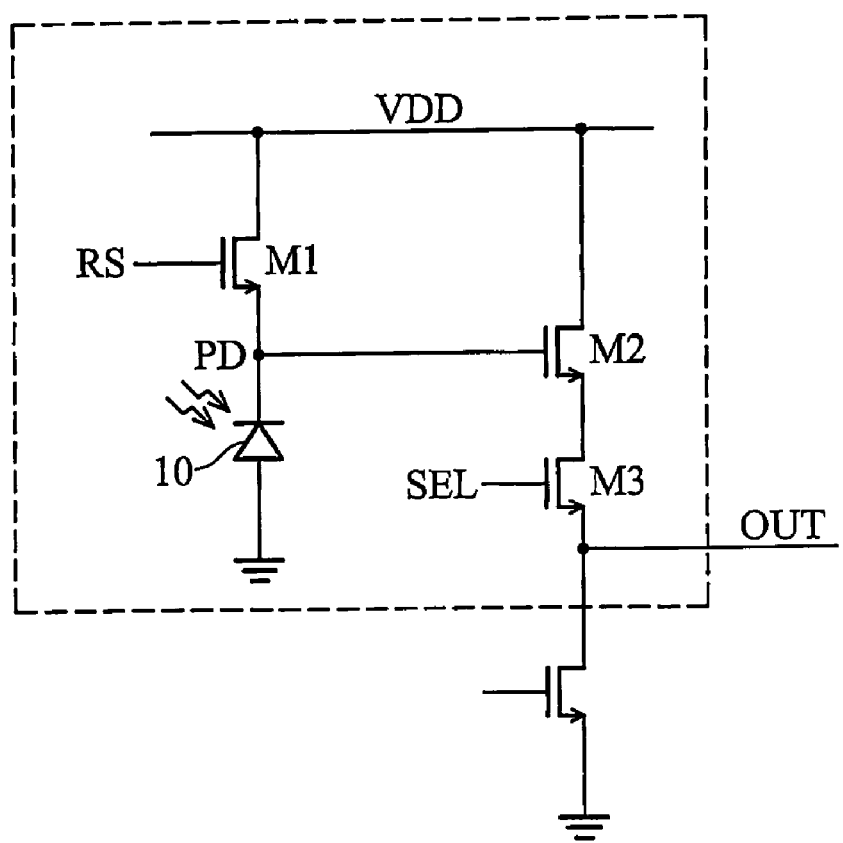
FIG. 1 is the a circuit diagram of a conventional analog pixel sensor.
Figure 2:
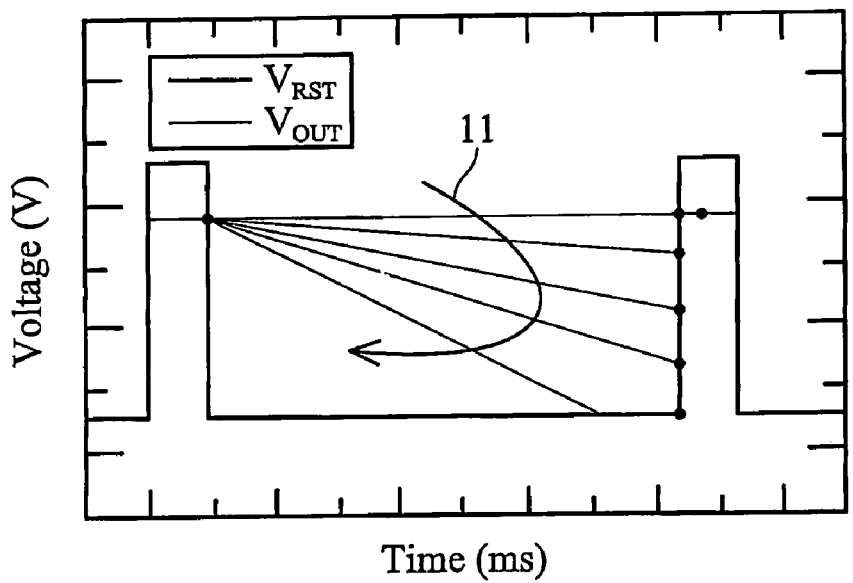
FIG. 2 shows the relationship between the output signal OUT of pixel sensor 1 and reset signal RS.
Figure 3:
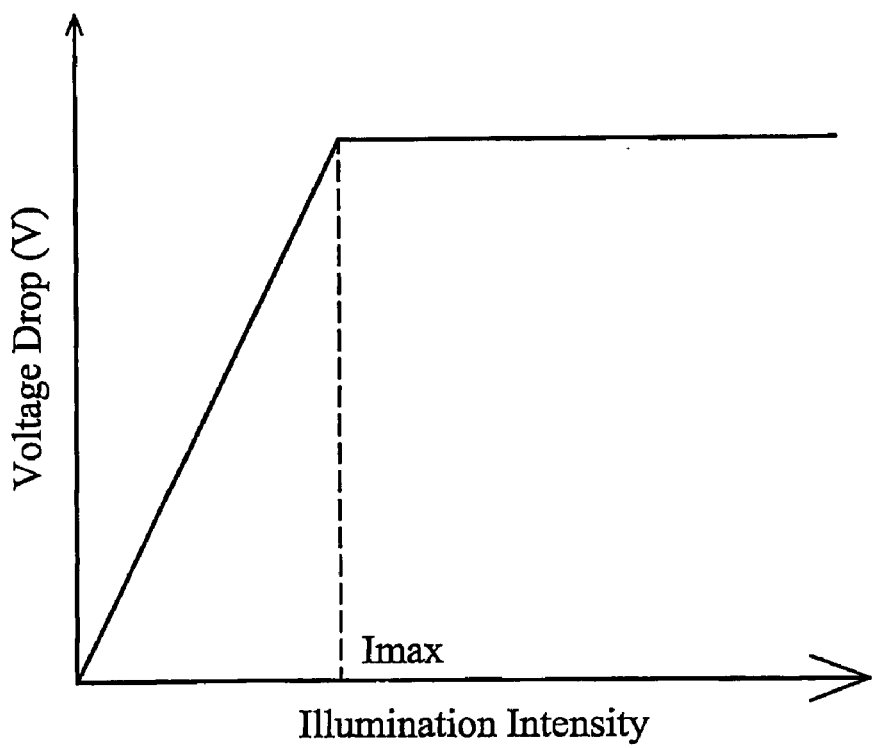
FIG. 3 shows the relationship between the illumination intensity and the voltage drop of the output signal OUT of the conventional analog pixel sensor.
Figure 7:
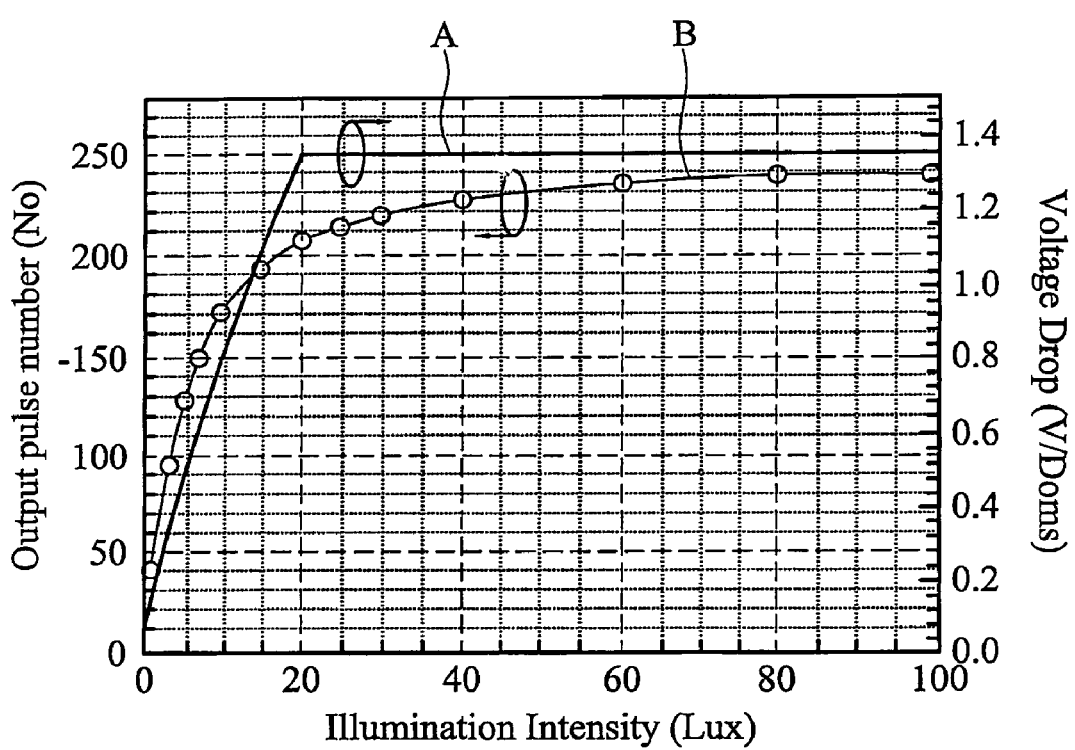
FIG. 7 compares the output curves of the digital pixel sensor in FIG. 5 with the conventional analog pixel sensor in FIG. 1.

FIG. 7 compares output curves of the digital pixel sensor 2 in FIG. 5 with the conventional analog pixel sensor 1 in FIG. 1. In FIG. 7, the x axis represents intensity of the incident light source, the right y axis represents the voltage drop, and the left y axis represents number of output pulses. The curve A, corresponding to the left y axis, represents the output curves of the conventional analog pixel sensor 1 sensing different intensities of the incident light source. The curve B, corresponding to the right y axis, represents the output curves of the digital pixel sensor 2 sensing different light intensities. As shown, the digital pixel sensor 2 of the invention generates a much smoother output curve with a larger dynamic range, the dynamic range defined as the ratio of maximum illumination intensity to minimum illumination intensity that the digital pixel sensor can detect. Sensitivity of the output in the digital pixel sensor can also be adjusted by changing the slope of the voltage Vref of the reference signal REF. The output curve is nonlinear, particularly due to the non-constant ramp voltage Vref. Another advantage of the present invention is that if illumination intensity is desired to have a resolution of 8 bits, it is only necessary to produce the clock signal CLK of 256 pulses when the first switch (or the PMOS transistor M4) is off. Similarly, only 1024 pulses of the clock signal CLK are needed when the first switch is off, to produce 10 bit output.

Figure 8A:
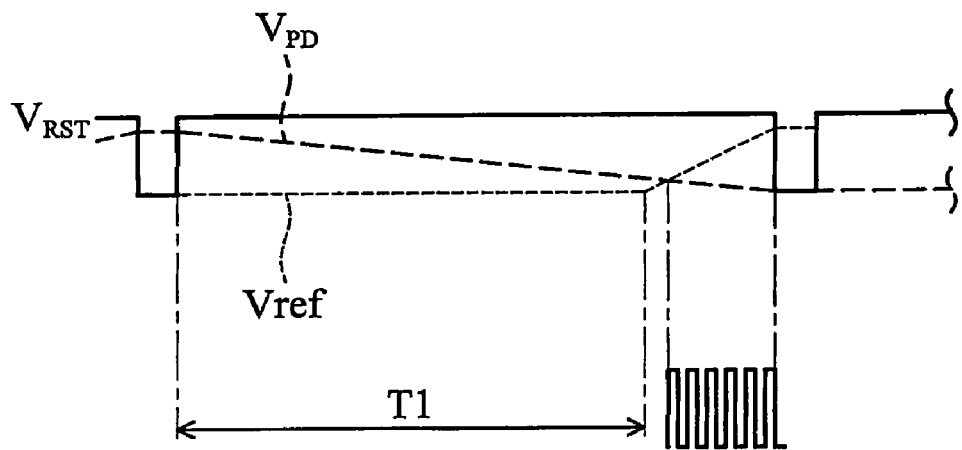
FIGS. 8a and 8b are operating timing diagrams of another operating method of the present invention.

According to the operating method described in FIG. 6, since the voltage Vref of the reference signal REF changes from low to high as soon as the voltage of the reset signal RST is pulled high, more time is needed to read the illumination intensity of the incident light source. FIG. 8 therefore provides another operating method taking less time to read the illumination intensity. The operating method triggers the voltage Vref of the reference signal later. Specifically, the voltage Vref of the reference signal REF is maintained at a low level when the first switch M4 is on, and when the first switch is turned off, it is maintained at the low level for a period T1 and then is increased with time.

Figure 8B:
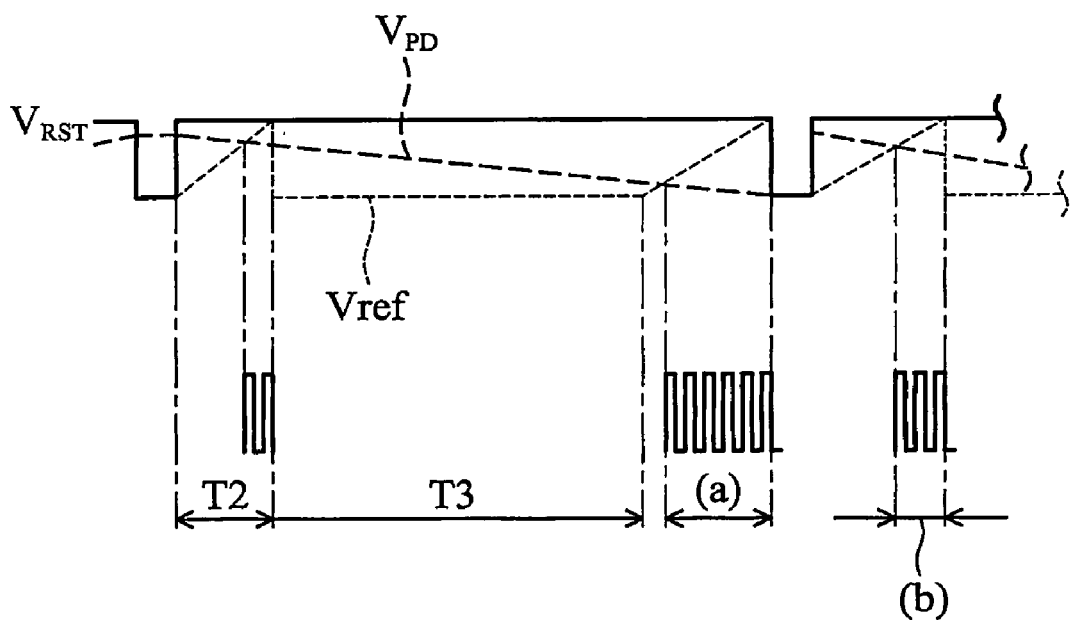

FIG. 8b proposes further another operating method, in which voltage Vref of the reference signal is maintained low when the first switch M4 is on and when the first switch M4 is turned off, it is increased with time for a period T2, and then is pulled down again to the low level for a period T3, and then is increased again with time. The intensity of the incident light source equals the sum of the pulses in intervals (a) and (b).

While the digital pixel sensor of the embodiment comprises comparison device 22, offset voltages of the comparison devices are various, thereby causing potential errors in application. This necessitates additional costs to eliminate the effect of the offset voltage. In view of this, another digital pixel sensor 2' is proposed in a second embodiment of the present invention for the elimination of detrimental effects produced by the offset voltage.

Figure 4:
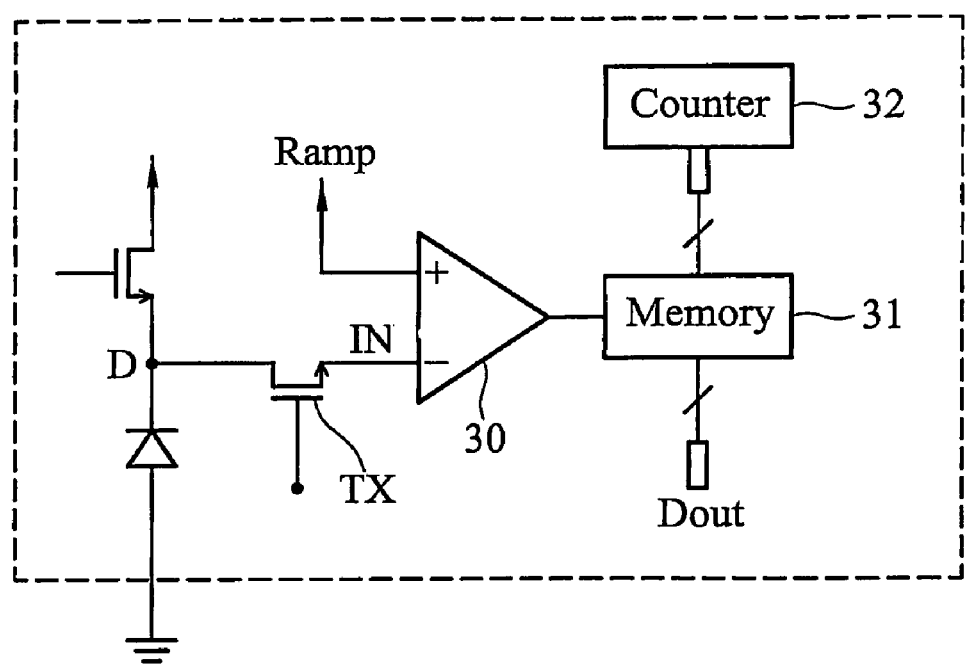
FIG. 4 is a schematic diagram of a pixel sensor proposed by Stanford Group.
Figure 9:
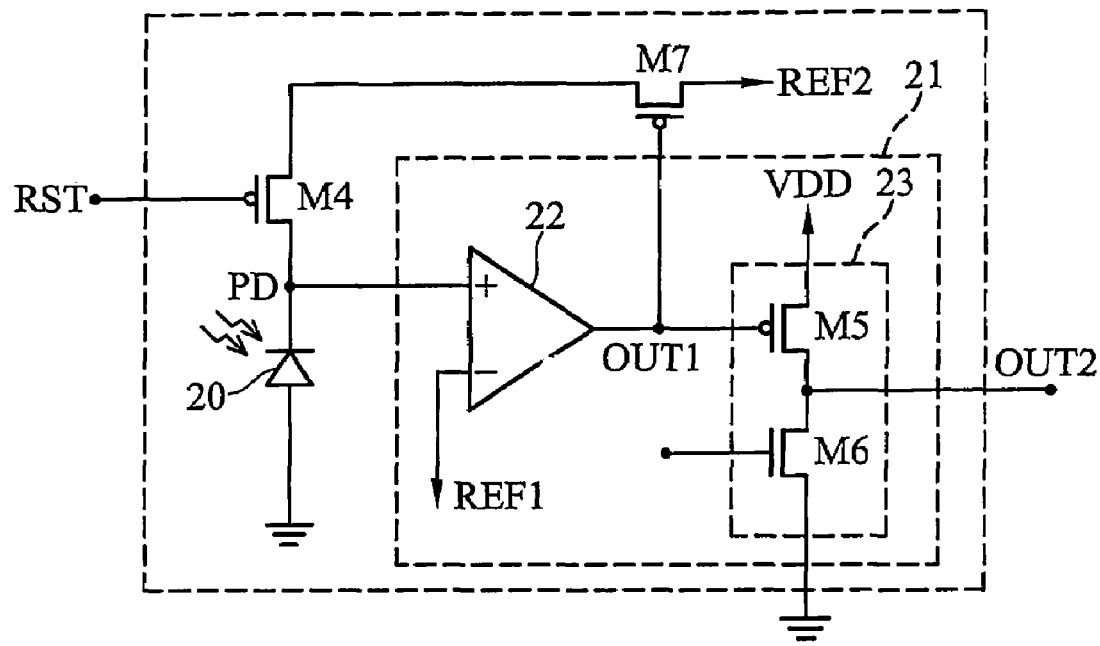
FIG. 9 is a circuit diagram of another embodiment of the present invention.

As shown in FIG. 9, the difference between the pixel sensor 2' and pixel sensor 2 in FIG. 4 is that it comprises an additional fourth switch M7, such as a PMOS transistor, coupled between the first switch M4 and an additional reference Vref2 (the second voltage source), with its gate (the control terminal) coupled to the output terminal OUT1 of the comparison device 22.

Figure 10:
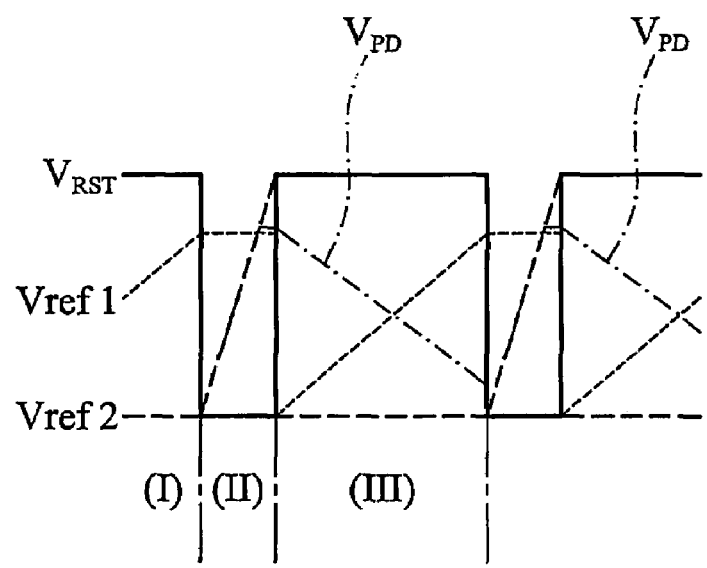
FIG. 10 is an operating timing diagram of the digital pixel sensor in FIG. 9.

FIG. 10 is the operation timing diagram of the digital pixel sensor 2' in FIG. 9, where VREF represents the voltage of the reference signal RST, Vref1 and Vref2 represent voltages of the reference signals REF1 and REF2 individually, and is divided into three periods (□), (□), and (□).

As shown in FIG. 9 and FIG. 10, in period (□), the voltage $V_{REST}$ of the reset signal RST is at a high level, causing the PMOS transistor M4 to turn off. The voltage VPD at node PD is nearly at zero. Concurrently, the voltage Vref1 of the reference signal REF1 is increased from a low level to a high level, pulling down the output voltage of the comparison device 22, which causes the PMOS transistor M7 to turn on. It should be noted that the voltage Vref2 of the reference signal REF2 in period (□) is at a low level.

In period (□), the voltage $V_{REST}$ of the reset signal RST is pulled down to a low level to turn on the PMOS transistor M4. Concurrently, the voltage Vref1 of the reference signal REF1 is maintained at the high level, while the voltage of the reference signal REF2 is increased from the low level to a high level. As the PMOS transistor M7 is now on, the voltage $V_{PD}$ at node PD increases with the increased Vref2. Because the high level of the voltage Vref2 exceeds that of the voltage Vref1, when the voltage Vref2 of the reference signal REF2 reaches Vref1+$V_{offest}$, the output of the comparison device 22 changes from low to high, thereby turning the PMOS transistor M7 off. At this time, the voltage VPD at node PD attains substantially Vref2+$V_{offset}$. Through the operation described, the voltage $V_{PD}$ at node PD includes voltage $V_{offset}$. Theoretically, the voltage $V_{PD}$ at node PD equals Vref1. However, if the comparison device 22 has an offset voltage $V_{offset}$, the voltage $V_{PD}$ becomes Vref1+$V_{offset}$. This means that the voltage $V_{PD}$ at node PD changes based on the magnitude of the offset voltage $V_{offeset}$ of the comparison device 22, thereby eliminating the effect produced by the offset voltage in the comparison device 22.

In period (□), the operation of the digital pixel sensor 2' is the same as that of the digital pixel sensor 2, and therefore is not explained for brevity.

Figure 11:
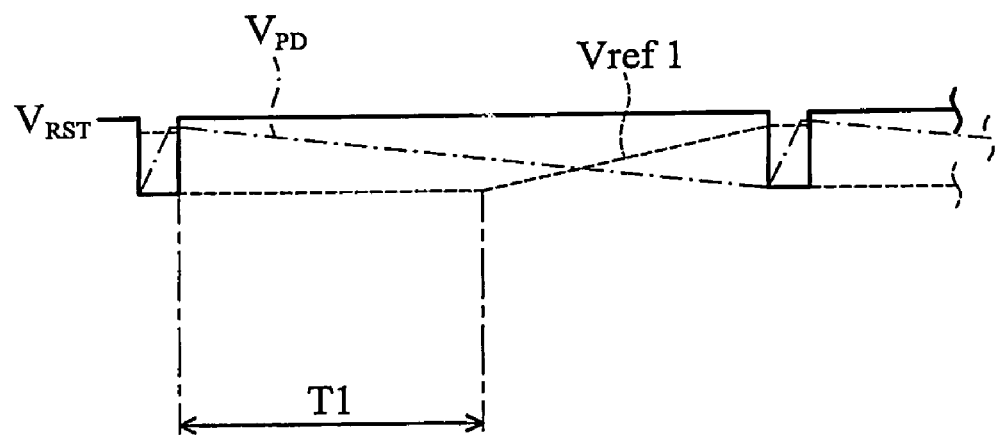
FIGS. 11a and 11b are additional operation timing diagrams of the digital pixel sensor in FIG. 9.
Figure 11:
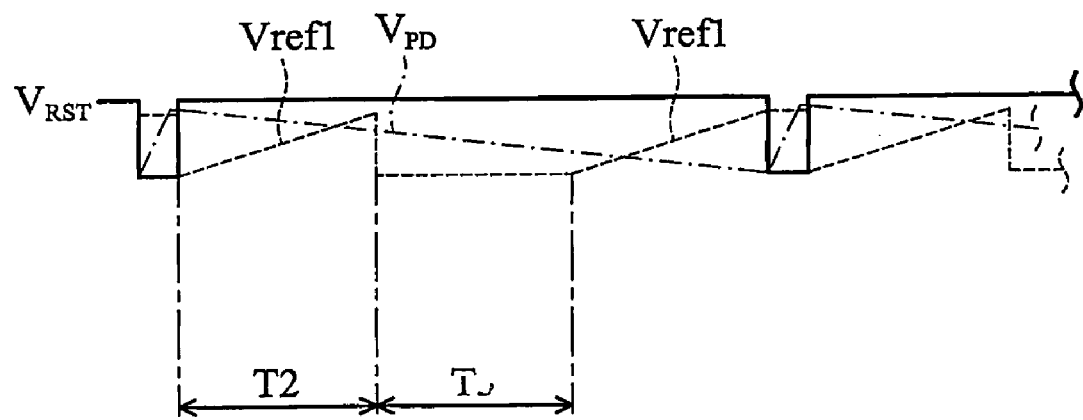

FIGS. 11a and 11b are different operating methods of the digital pixel sensor 2'. The difference between FIG. 11a and FIG. 10 is that when $V_{REST}$ is low so that the PMOS transistor M4 (the first switch) is on, the voltage Vref1 of the reference signal REF is maintained at a high level. After $V_{REST}$ is changed to high and the PMOS transistor M4 is turned off in response, the voltage Vref1 of the reference signal REF is maintained at a low level for a period T1 and then is increased with time back to the high level.

Referring next to FIG. 10b, the difference between FIG. 11b and FIG. 10 is that when $V_{REST}$ is low, such that PMOS transistor M4 (the first switch) turns on, the voltage Vref1 of the reference signal REF is maintained at a high level. After $V_{REST}$ is changed to high, such that PMOS transistor M4 turns off, the voltage Vref1 of the reference signal REF is increased with time from a low level for a first predetermined period T2 and then is lowered to maintain at the low level for a second predetermined period T3 and then is increased again with time back to the high level.

Figure 12A:
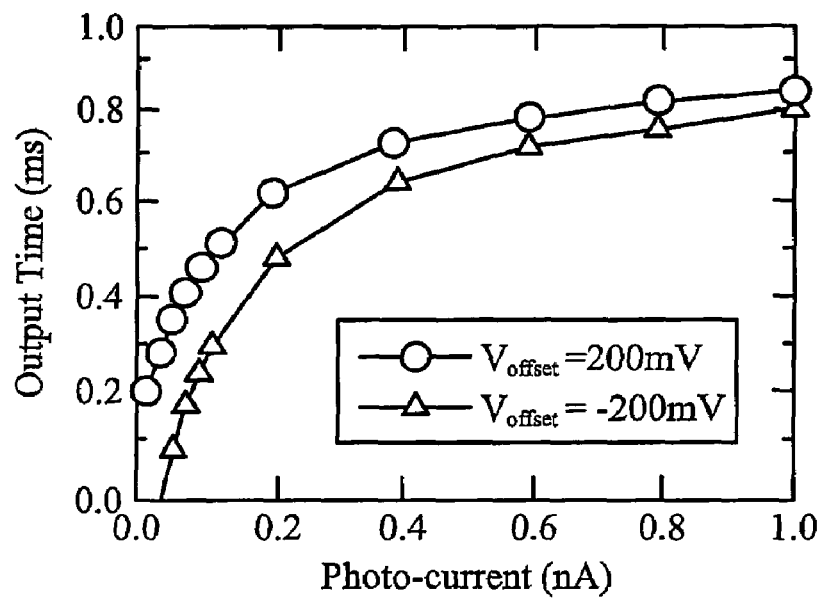
FIG. 12a compares output characteristic curves corresponding to offset voltages of the digital pixel sensor in FIG. 5.

FIG. 12a illustrates simulated outputs of the digital pixel image sensor 2 in FIG. 5 with an offset voltage $V_{offest}$, where the offset voltage Voffest of the comparison device is assumed to be ±200 mV. In the figure, the digital pixel sensor transforms the current that corresponds to the illumination intensity into a time length corresponding to the number of pulses and then outputs the time length. From FIG. 12, it is observed that the output characteristic curve of the digital pixel sensor varies with the offset voltage.

Figure 12B:
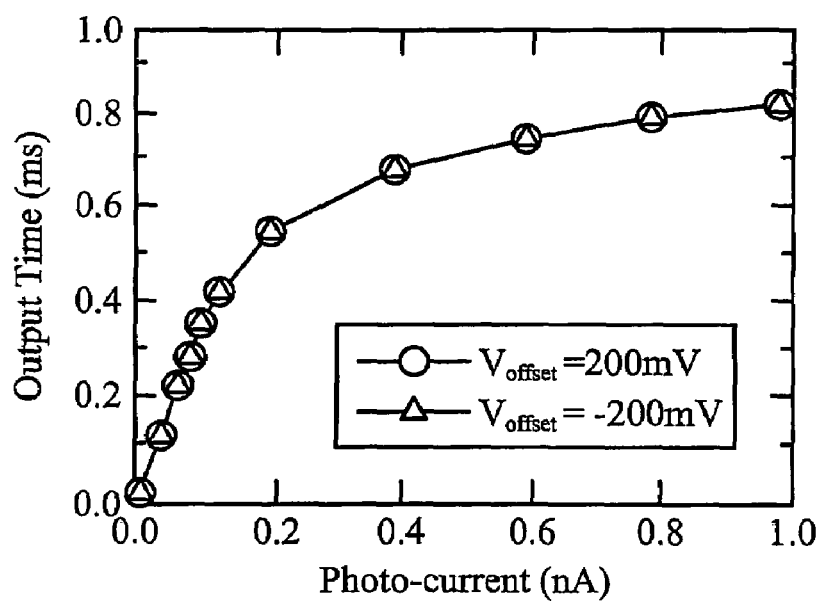
FIG. 12b compares output characteristic curves corresponding to offset voltages of the digital pixel sensor in FIG. 9.

FIG. 12b illustrates the output simulation outputs of the digital pixel sensor 2' in FIG. 9. It is noticed that even though the comparator has an offset $V_{offest}$ of ±200 mV, the output characteristic curves are almost the same. Therefore the pixel sensor 2' in FIG. 9 is indeed capable of eliminating the problem caused the offset voltages.

Thus, the digital pixel sensors in accordance with all the embodiments of the present invention offer more output types, wilder dynamic range, and more flexible to adjustment of output. As well, the digital pixel sensor in accordance with the embodiments in the present invention requires merely about 10 transistors, with resultingly conserved production costs than the digital pixel sensor proposed by Stanford Group.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pixel sensor comprising:
 a first switch coupled between a first voltage source and a first node, turned on or off by a reset signal, thereby providing a first voltage from the first voltage source to the first node when turned on;
 a light sensing unit coupled to the first node generating a transformation current responsive to an incident light source and transforming the transformation current to the first node; and
 a decision device coupled to the first node and a reference signal, generating an intensity reference signal comprising a plurality of pulses with pulse numbers corresponding to the intensity of the incident light source when the voltage at the first node is lower than that of the reference signal, wherein the decision device comprises:
a comparison device for comparing the voltage at the first node with that of the reference signal and outputting an enable signal when the voltage at the first node is less than that of the reference signal; and
a transformation device coupled with the comparison device, transforming the intensity of the incident light source into the intensity reference signal after receiving the enable signal,
wherein the transformation device comprises:
a second switch coupled to a second voltage source and the output terminal of the pixel sensor, turning on or off according to the enable signal, allowing the second voltage source to provide the output terminal with a second voltage when turned on; and
a third switch coupled between the output terminal and a voltage reference node, turning on or off according to a first clock signal, transforming the second voltage into the intensity reference signal.

2. The pixel sensor as claimed in claim 1, wherein the second switch is a PMOS transistor, and the third switch is a NMOS transistor.

3. A pixel sensor comprising:
a first switch coupled between a first voltage source and a first node, turned on or off by a reset signal, thereby providing a first voltage from the first voltage source to the first node when turned on;
a light sensing unit coupled to the first node generating a transformation current responsive to an incident light source and transferring the transformation current to the first node; and
a decision device coupled to the first node and a reference signal, generating an intensity reference signal comprising a plurality of pulses with pulse numbers corresponding to the intensity of the incident light source when the voltage at the first node is lower than that of the reference signal,
wherein the decision device comprises:
a comparison device for comparing the voltage at the first node with that of the reference signal and outputting an enable signal when the voltage at the first node is less than that of the reference signal;
a transformation device coupled with the comparison device, transforming the intensity of the incident light source into the intensity reference signal after receiving the enable signal; and
a second switch coupled between the first switch and the first voltage source, wherein the second switch has a control terminal coupled with the output terminal of the comparison device.

4. An operating method of a pixel sensor comprising a first switch coupled between a first voltage source and a first node, a light sensing unit coupled to the first node, and a decision device coupled with the first node and a reference signal, the operating method comprising:
sending a reset signal to the first switch to turn it on and equal the voltage at the first node with a first voltage originating with the first voltage source;
interrupting transmission the reset signal to the first switch to turn off the first switch to further maintain the voltage at the first node at the first voltage;
illuminating the light sensing unit with an incident light source to generate a transformation current in the light sensing unit, wherein the transformation current flows to the first node, thereby changing the voltage at the first node;
detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;
maintaining the voltage of the reference signal at a predetermined level when the first switch is on and when the first switch is off, maintaining the voltage of the reference signal at the predetermined level for a predetermined period and then increasing the voltage of the reference signal with time.

5. An operating method of a pixel sensor comprising a first switch coupled between a first voltage source and a first node, a light sensing unit coupled to the first node, and a decision device coupled with the first node and a reference signal, the operating method comprising:
sending a reset signal to the first switch to turn it on and equal the voltage at the first node with a first voltage originating with the first voltage source;
interrupting transmission the reset signal to the first switch to turn off the first switch to further maintain the voltage at the first node at the first voltage;
illuminating the light sensing unit with an incident light source to generate a transformation current in the light sensing unit, wherein the transformation current flows to the first node, thereby changing the voltage at the first node;
detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;
maintaining the voltage of the reference signal at a predetermined level when the first switch is on and when the first switch is off, increasing the voltage of the reference with time for a first predetermined period, maintaining the voltage of the reference signal at the predetermined level for a second predetermined period, and increasing the voltage of the reference signal with time again.

6. A operating method of a pixel sensor comprising a first switch coupled between a first voltage source and a first node, a light sensing unit coupled to the first node, and a decision device coupled with the first node and a reference signal, the operating method comprising:
sending a reset signal to the first switch to turn it on and equal the voltage at the first node with a first voltage originating with the first voltage source;
interrupting transmission the reset signal to the first switch to turn off the first switch to further maintain the voltage at the first node at the first voltage;
illuminating the light sensing unit with an incident light source to generate a transformation current in the light sensing unit, wherein the transformation current flows to the first node, thereby changing the voltage at the first node;
detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;
wherein the decision device further comprises a comparison device for comparing the voltage at the first node to that of the reference signal, a second switch coupled between an output terminal of the pixel sensor and a second voltage source, and a third switch coupled between the output terminal and a voltage reference node, wherein the operating method comprises turning the third switch on or off through a clock signal to transform a second voltage of the second voltage source into the intensity reference signal; and changing pulse numbers of the clock signal when the first switch is off to adjust digital resolutions of an output signal output from the output terminal.

7. The operating method of the pixel sensor as claimed in claim 6, wherein the adjusting is performed when the clock signal is not zero.

8. An operating method of a pixel sensor comprising a first switch coupled between a first voltage source and a first node, a light sensing unit coupled to the first node, a decision device coupled with the first node and a reference signal, and a second switch coupled between the first switch and the first voltage source, the operating method comprising:

sending a reset signal to the first switch to turn it on and equal the voltage at the first node with a first voltage originating with the first voltage source;

interrupting transmission the reset signal to the first switch to turn off the first switch to further maintain the voltage at the first node at the first voltage;

illuminating the light sensing unit with an incident light source to generate a transformation current in the light sensing unit, wherein the transformation current flows to the first node, thereby changing the voltage at the first node;

detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;

maintaining the voltage of the first voltage source at a first predetermined level when the first switch is on and when the first switch is off, increasing the voltage of the first voltage source with time.

9. An operating method of a pixel sensor comprising a first switch coupled between a first voltage source and a first node, a light sensing unit coupled to the first node, a decision device coupled with the first node and a reference signal, and a second switch coupled between the first switch and the first voltage source, the operating method comprising:

sending a reset signal to the first switch to turn it on and equal the voltage at the first node with a first voltage originating with the first voltage source;

interrupting transmission the reset signal to the first switch to turn off the first switch to further maintain the voltage at the first node at the first voltage;

illuminating the light sensing unit with an incident light source to generate a transformation current in the light sensing unit, wherein the transformation current flows to the first node, thereby changing the voltage at the first node;

detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;

maintaining the voltage of the reference signal at a second predetermined level when the first switch is on and when the first switch is off, increasing the voltage of the reference signal with time from a third predetermined level back to the second predetermined level.

10. An operating method of a pixel sensor comprising a first switch coupled between a first voltage source and a first node, a light sensing unit coupled to the first node, a decision device coupled with the first node and a reference signal, and a second switch coupled between the first switch and the first voltage source, the operating method comprising:

sending a reset signal to the first switch to turn it on and equal the voltage at the first node with a first voltage originating with the first voltage source;

interrupting transmission the reset signal to the first switch to turn off the first switch to further maintain the voltage at the first node at the first voltage;

illuminating the light sensing unit with an incident light source to generate a transformation current in the light sensing unit, wherein the transformation current flows to the first node, thereby changing the voltage at the first node;

detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;

maintaining the voltage of the reference signal at a second predetermined level when the first switch is on and when the first switch is off, maintaining the voltage of the reference with time at a third predetermined level for a predetermined period first, and increasing it with time back to the second predetermined level.

11. An operating method of a pixel sensor comprising a first switch coupled between a first voltage source and a first node, a light sensing unit coupled to the first node, a decision device coupled with the first node and a reference signal, and a second switch coupled between the first switch and the first voltage source, the operating method further comprising:

sending a reset signal to the first switch to turn it on and equal the voltage at the first node with a first voltage originating with the first voltage source;

interrupting transmission the reset signal to the first switch to turn off the first switch to further maintain the voltage at the first node at the first voltage;

illuminating the light sensing unit with an incident light source to generate a transformation current in the light sensing unit, wherein the transformation current flows to the first node, thereby changing the voltage at the first node;

detection the voltage of the reference signal and that at the first node by the decision device, and outputting an intensity reference signal comprising a plurality of pulses with pulse numbers corresponding to the intensity of the incident light source through the decision device when the voltage at the first node is lower than that of the reference signal;

maintaining the voltage of the reference signal at a second predetermined level when the first switch is on and when the first switch is off, increasing the voltage of the reference with time from a third predetermined level for a first predetermined period first, maintaining it at the third predetermined level for a second predetermined period , and increasing it again with time back to the second predetermined level.

* * * * *